United States Patent
Zhang et al.

(10) Patent No.: US 11,152,264 B2
(45) Date of Patent: Oct. 19, 2021

(54) MULTI-VT SCHEME WITH SAME DIPOLE THICKNESS FOR GATE-ALL-AROUND TRANSISTORS

(71) Applicant: INTERNATIONAL BUSINESS MACHINES CORPORATION, Armonk, NY (US)

(72) Inventors: Jingyun Zhang, Albany, NY (US); Takashi Ando, Eastchester, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 16/736,873

(22) Filed: Jan. 8, 2020

(65) Prior Publication Data
US 2021/0210388 A1    Jul. 8, 2021

(51) Int. Cl.
*H01L 21/8234*    (2006.01)
*H01L 29/86*    (2006.01)
(Continued)

(52) U.S. Cl.
CPC .... *H01L 21/82345* (2013.01); *H01L 27/0886* (2013.01); *H01L 29/42392* (2013.01); *H01L 29/78696* (2013.01)

(58) Field of Classification Search
CPC ................. H01L 21/82345; H01L 29/42392
See application file for complete search history.

(56) References Cited

U.S. PATENT DOCUMENTS 8,786,030 B2 *  7/2014  Ando ............... H01L 29/66545
                                              257/410
9,397,199 B1 *  7/2016  Kwon ................... H01L 29/517
(Continued)

FOREIGN PATENT DOCUMENTS

CN      108364910 A      8/2018
CN      109904219 A      6/2019
CN      109904235 A      6/2019

OTHER PUBLICATIONS

J. Zhang et al., High-k Metal Gate Fundamental Learning and Multi-Vt Options for Stacked Nanosheet Gate-All-Around Transistor, Dec. 2017, IEEE International Electron Devices Meeting, IEDM17-537, pp. 22.1.1 to 22.1.4. (Year: 2017).*

(Continued)

*Primary Examiner* — Victoria K. Hall
(74) *Attorney, Agent, or Firm* — Tutunjian & Bitetto, P.C.; Jeffrey S. LaBaw

(57) ABSTRACT

A method is presented for attaining different gate threshold voltages across a plurality of field effect transistor (FET) devices. The method includes forming first, second, and third nanosheet stacks, removing sacrificial layers of the first, second, and third nanosheet stacks, and depositing an interfacial layer and a high-k layer within the first, second, and third nanosheet stacks. The method further includes depositing a first work function metal (WFM) layer within the first nanosheet stack having a first thickness, depositing a second WFM layer within the second nanosheet stack having a second thickness, wherein the second thickness is greater than the first thickness, depositing a third WFM layer within the third nanosheet stack having a third thickness, wherein the third thickness is greater than the second thickness, depositing a dipole material, and diffusing the (Continued)

dipole material into the IL to provide different gate threshold voltages for the plurality of FET devices.

20 Claims, 11 Drawing Sheets

(51) Int. Cl.
*H01L 27/088* (2006.01)
*H01L 29/423* (2006.01)
*H01L 29/786* (2006.01)

(56) References Cited

U.S. PATENT DOCUMENTS

| | | | | |
|---|---|---|---|---|
| 9,613,866 | B2* | 4/2017 | Ando | H01L 21/2636 |
| 9,613,870 | B2* | 4/2017 | Ando | H01L 21/28194 |
| 9,793,368 | B2* | 10/2017 | Son | H01L 29/7851 |
| 9,812,449 | B2 | 11/2017 | Obradovic et al. | |
| 9,997,361 | B2* | 6/2018 | Ando | H01L 21/28185 |
| 9,997,519 | B1* | 6/2018 | Bao | H01L 29/4966 |
| 9,997,610 | B2* | 6/2018 | Ando | H01L 29/518 |
| 10,002,791 | B1* | 6/2018 | Bao | H01L 21/823821 |
| 10,026,652 | B2 | 7/2018 | Wang et al. | |
| 10,128,347 | B2 | 11/2018 | Bao et al. | |
| 10,304,835 | B1* | 5/2019 | Tsai | H01L 21/823857 |
| 10,319,846 | B1* | 6/2019 | Ando | H01L 29/401 |
| 10,811,413 | B2* | 10/2020 | Ando | H01L 21/28202 |
| 10,825,736 | B1* | 11/2020 | Zhang | H01L 21/02186 |
| 2010/0102393 | A1* | 4/2010 | Lee | H01L 29/4966 257/369 |
| 2010/0261342 | A1* | 10/2010 | Clark | H01L 29/513 438/591 |
| 2012/0104475 | A1* | 5/2012 | Anderson | H01L 29/94 257/288 |
| 2013/0264652 | A1* | 10/2013 | Zhu | H01L 21/823443 257/369 |
| 2014/0048865 | A1* | 2/2014 | Toh | H01L 29/4234 257/324 |
| 2017/0005003 | A1* | 1/2017 | Ando | H01L 21/28194 |
| 2017/0005006 | A1* | 1/2017 | Ando | H01L 27/088 |
| 2017/0133477 | A1* | 5/2017 | Ando | H01L 21/28185 |
| 2017/0140940 | A1* | 5/2017 | Ando | H01L 21/28194 |
| 2019/0088798 | A1* | 3/2019 | Kim | H01L 29/0653 |
| 2019/0148237 | A1 | 5/2019 | Wang | |
| 2020/0020690 | A1* | 1/2020 | Ando | H01L 29/0673 |
| 2020/0051979 | A1* | 2/2020 | Ando | H01L 29/42364 |
| 2020/0373300 | A1* | 11/2020 | Zhang | H01L 29/0673 |
| 2021/0082915 | A1* | 3/2021 | Bao | H01L 29/66795 |

OTHER PUBLICATIONS

D. James, High-k/Metal Gates in Leading Edge Silicon Devices, 2012, ASMC 2012 Proceedings, 346-353. (Year: 2012).*

E. Dentoni Litta et al., CMOS integration of high-k/metal gate transistors in diffusion and gate replacement (D&GR) scheme for dynamic random access memory peripheral circuits, Mar. 16, 2018, Japanese J. of Applied Physics, vol. 57, No. 4S, 04FB08-1 to 04FB08-5. (Year: 2018).*

Y. Oniki et al., Selective Etches for Gate-All-Around (GAA) Device Integration: Opportunities and Challenges, 2019, ECS Transactions, vol. 92, No. 3, pp. 3-12. (Year: 2019).*

P. Kirsch et al., Dipole model explaining high-k/metal gate field effect transistor threshold voltage tuning, Mar. 4, 2008, Applied Physics Letters, vol. 92, No. 092901, pp. 092901-1 to 092901-3 (Year: 2008).*

* cited by examiner

MULTI-VT SCHEME WITH SAME DIPOLE THICKNESS FOR GATE-ALL-AROUND TRANSISTORS

BACKGROUND

The present invention relates generally to semiconductor devices, and more specifically, to a multi-Vt scheme with same dipole thickness for gate-all-around transistors.

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of device size scaling. While fin field effect transistors (finFETs) and/or nanosheets can benefit from tight device-device spacing, these dimensions can limit device scaling. Further, devices needing a thicker dielectric for higher voltage operation are even more limited in the allowable dimensions. Higher voltage devices for input and/or output circuits need thicker gate dielectrics as compared to standard gate devices, which have a lower voltage and can be employed, e.g., in logic devices.

SUMMARY

In accordance with an embodiment, a method is provided for attaining different gate threshold voltages across a plurality of field effect transistor (FET) devices without patterning between nanosheet channels. The method includes forming a first nanosheet stack, a second nanosheet stack, and a third nanosheet stack, removing sacrificial layers of the first, second, and third nanosheet stacks, depositing an interfacial layer (IL) and a high-k (HK) layer within the first, second, and third nanosheet stacks, selectively depositing a first work function metal (WFM) layer within the first nanosheet stack having a first thickness, selectively depositing a second WFM layer within the second nanosheet stack having a second thickness, wherein the second thickness is greater than the first thickness, selectively depositing a third WFM layer within the third nanosheet stack having a third thickness, wherein the third thickness is greater than the second thickness, depositing a dipole material adjacent the first, second, and third WFM layers, and diffusing the dipole material, by anneal, into the IL to provide different gate threshold voltages for the plurality of FET devices.

In accordance with another embodiment, a method is provided for attaining different gate threshold voltages across a plurality of field effect transistor (FET) devices without patterning between nanosheet channels. The method includes forming a plurality of nanosheet stacks, removing sacrificial layers of the plurality of nanosheet stacks, depositing an interfacial layer (IL) and a high-k (HK) layer within each of the plurality of nanosheet stacks, selectively depositing work function metal (WFM) layers with different thicknesses adjacent the plurality of nanosheet stacks, depositing a dipole material adjacent the WFM layers, and diffusing the dipole material, by anneal, into the IL of each of the plurality of nanosheet stacks to provide different gate threshold voltages for the plurality of FET devices.

In accordance with yet another embodiment, a semiconductor device for attaining different gate threshold voltages across a plurality of field effect transistor (FET) devices without patterning between nanosheet channels is provided. The semiconductor device includes a plurality of nanosheet stacks, an interfacial layer (IL) and a high-k (HK) layer disposed within each of the plurality of nanosheet stacks, work function metal (WFM) layers with different thicknesses disposed adjacent the plurality of nanosheet stacks, and a dipole material diffused into the IL of each of the plurality of nanosheet stacks to provide different gate threshold voltages for the plurality of FET devices.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
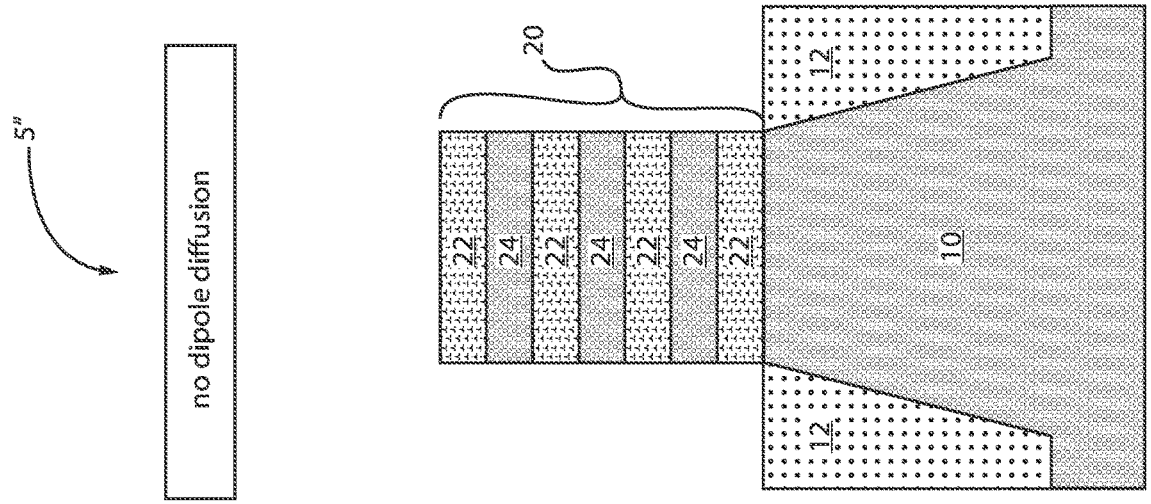
FIG. 1 is a cross-sectional view of a semiconductor structure where nanosheet structures are formed over a substrate to define multiple work function gate stacks, in accordance with an embodiment of the present invention.
Figure 1:
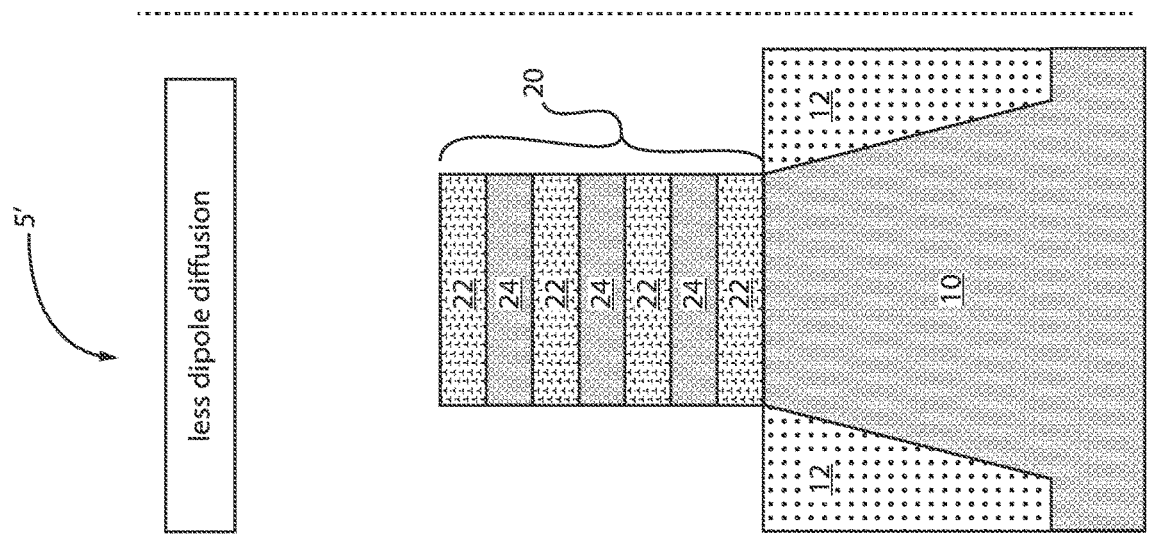
Figure 1:
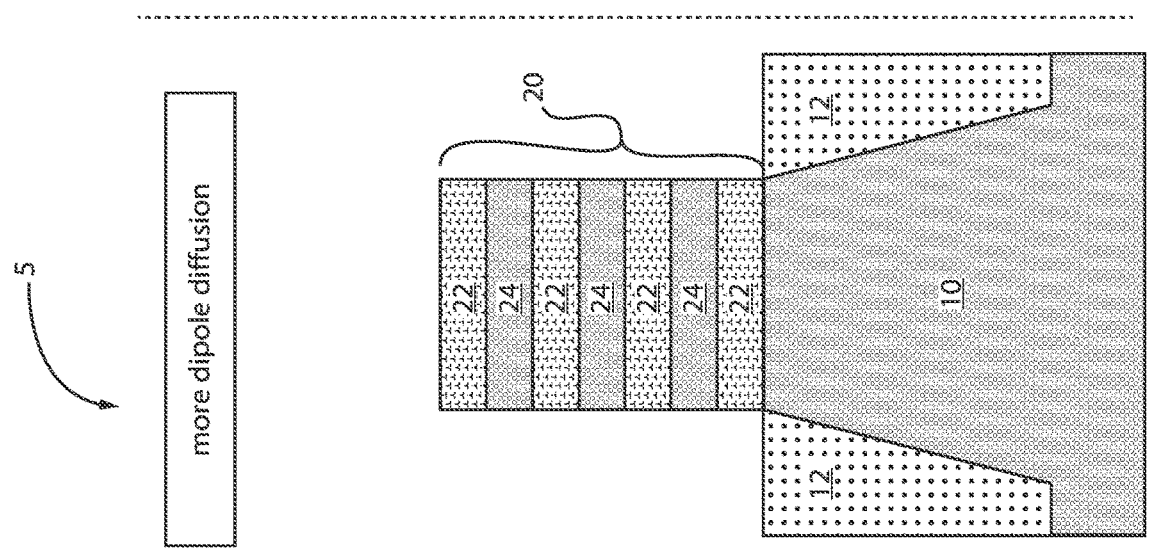

Embodiments in accordance with the present invention provide methods and devices for achieving different threshold voltages for field effect transistor (FET) devices without degrading logic device performance. The exemplary methods and structures achieve multi-Vt with selective dipole diffusion on selected nanosheet regions. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

Gate-all-around structure FETs, such as nanosheet (NS) devices, can provide better electrostatic control in order to meet the needs for further aggressive device scaling. Multiple work function gate stacks are necessary to achieve CMOS technology with multiple threshold voltages (Vt) on fully depleted channel architectures (e.g., nanosheet) to take advantage of higher mobility and smaller device variability due to the absence of channel doping. Dipole engineering with multi-Vt patterning needs larger intersheet spacing (Tsus) for nanosheet devices. However, large Tsus degrades device performance due to increasing parasitic capacitance. Hence, there is no multi-Vt dipole scheme run path for nanosheet devices.

Embodiments in accordance with the present invention provide exemplary methods and devices for achieving a NS multi-Vt scheme with dipole engineering without the need for dipole patterning. The exemplary methods and structures resolve multi-Vt challenges for gate-all-around transistors without sacrificing device performance by using the unique property of dipole diffusion amount to create different Vt flavors and by employing different sacrificial metal thicknesses underneath the dipole layer to selectively block part of the dipole diffusion and to create different Vt flavors. This can be achieved without patterning of the dipole forming layer, which makes this exemplary scheme compatible with NS devices with aggressively scaled Tsus. Also, there is no concern with reference to dipole etch out variation due to patterning. Thus, a single dipole layer thickness can be used to achieve, e.g., more than three Vt pairs by adjusting sacrificial material thicknesses.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure where nanosheet structures are formed over a substrate to define multiple work function gate stacks, in accordance with an embodiment of the present invention.

A semiconductor structure 5 includes a semiconductor substrate 10. Shallow trench isolation (STI) regions 12 are also illustrated adjacent the substrate 10. A nanosheet stack 20 can be formed over the substrate 10. The nanosheet stack 20 can include, e.g., alternating layers of a first semiconductor material 22 and a second semiconductor material 24. The first semiconductor material 22 can be, e.g., silicon germanium (SiGe) and the second semiconductor material 24 can be, e.g., silicon (Si).

Structure 5 will represent a work function gate stack where more dipole diffusion takes place. Structure 5' will represent a work function gate stack where less dipole diffusion takes place. Structure 5" will represent a work function gate stack where no dipole diffusion takes place. Such dipole diffusion will be better illustrated with reference to FIGS. 9 and 10.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The shallow trench isolation (STI) regions 12 can be formed by etching a trench in doped bottom source/drain (S/D) regions (not shown) utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric 12 can optionally be densified after deposition. A conventional planarization process such as chemical-mechanical polishing (CMP) can optionally be used to provide a planar structure.

Examples of semiconductor materials that can be used in forming such nanosheet structures 20 include at least silicon (Si), germanium (Ge), silicon germanium alloys (SiGe), silicon carbide (SiC), silicon germanium carbide (SiGeC), III-V compound semiconductors and/or II-VI compound semiconductors. One skilled in the art can contemplate a number of different semiconductor materials for forming the nanosheet structures 20.

Referring to the nanosheet stacks 20, the first semiconductor layer 22 can be the first layer in a stack of sheets of alternating materials. The first nanosheet stacks 20 include first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
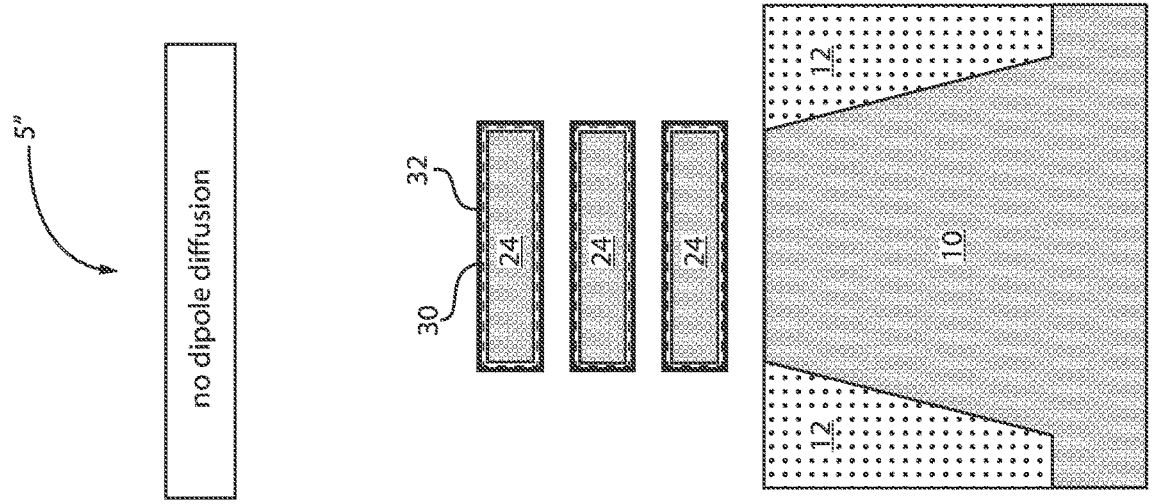
FIG. 2 is a cross-sectional view of the semiconductor structure of FIG. 1 where the sacrificial layer of the nanosheet structures is removed, and an interfacial layer (IL) and a high-k material are deposited, in accordance with an embodiment of the present invention.
Figure 2:
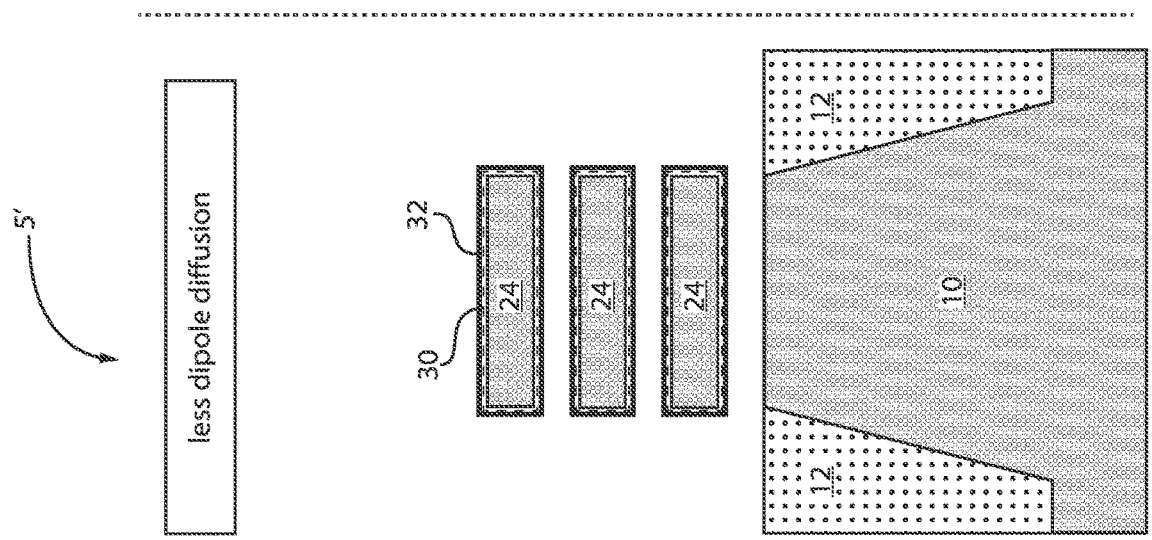
Figure 2:
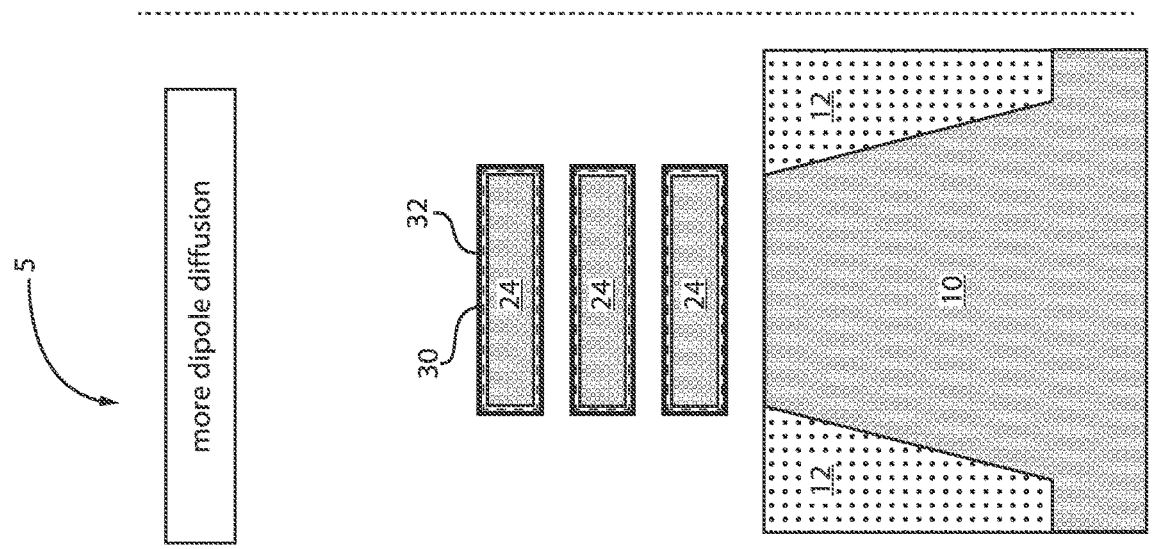

FIG. 2 is a cross-sectional view of the semiconductor structure of FIG. 1 where the sacrificial layer of the nanosheet structures is removed, and an interfacial layer (IL) and a high-k material are deposited, in accordance with an embodiment of the present invention.

In various example embodiments, the sacrificial layer 22 of the nanosheet structures 20 is removed, an interfacial layer (IL) 30 and a high k material (HK) 32 are deposited. The sacrificial layer 22 etched or removed can be alternating SiGe layers. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

IL 30 and HK 32 can be formed adjacent the remaining alternating semiconductor layers 24 of the nanosheet structures 20. The remaining semiconductor layers 24 can be, e.g., Si layers. In one example, a high-k material and a work function metal can be deposited. The HK 32 can be any of the materials $HfO_x$, $HfSiO_x$, $Al_2O_3$, $ZrO_2$, $ZrSiO_x$, among other materials. The work function material can include any of the following metal compounds TiN, TaN, TiC, TaC, $La_2O_3$, Al, $AlO_x$, among other materials. The HK 32 can be deposited by PVD, CVD or ALD processes. The HK 32 can be planarized by, e.g., chemical mechanical planarization (CMP).

Figure 3:
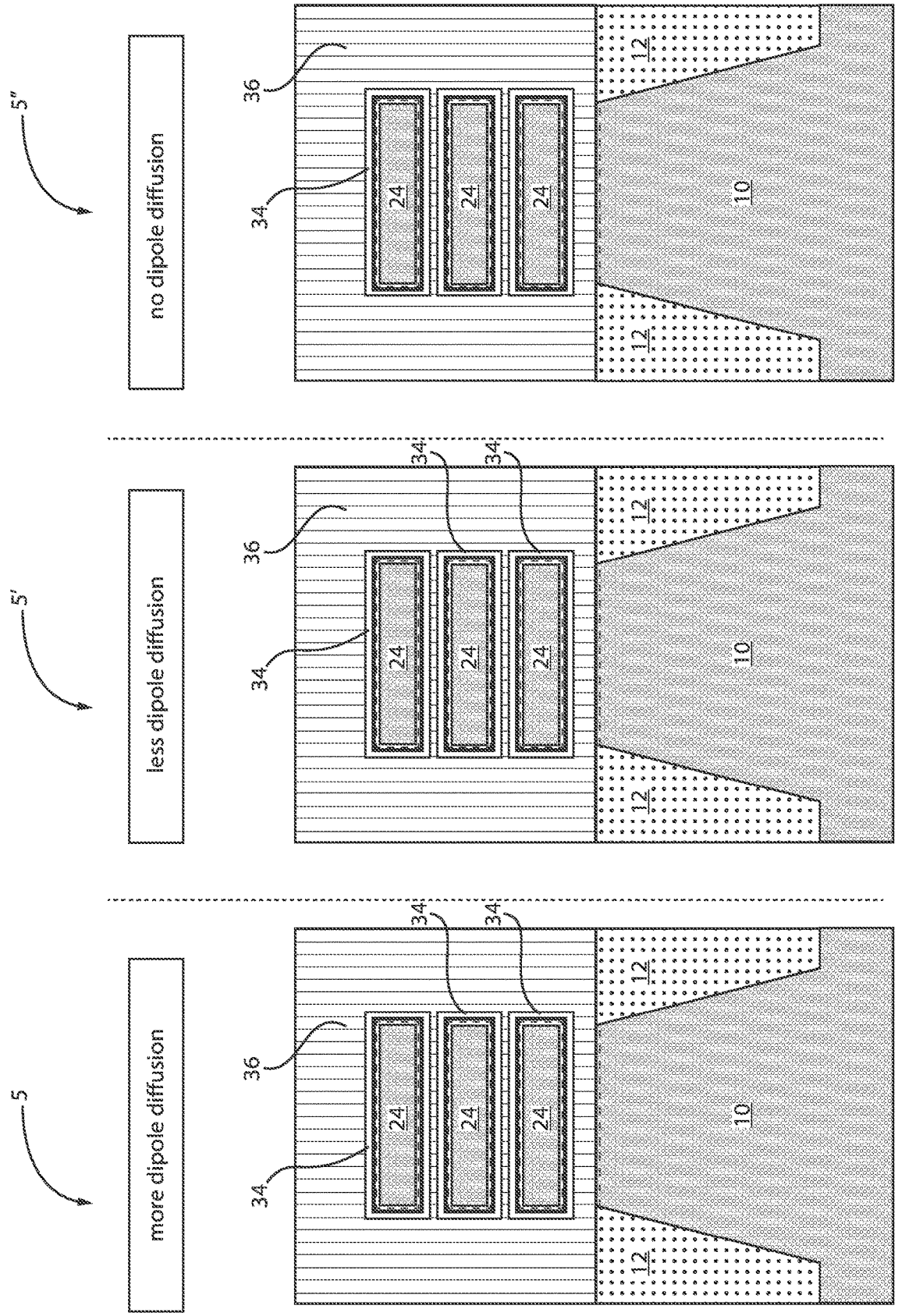
FIG. 3 is a cross-sectional view of the semiconductor structure of FIG. 2 where a first work function metal layer is deposited adjacent the high k material and a first sacrificial patterning material is deposited thereon, in accordance with an embodiment of the present invention.

FIG. 3 is a cross-sectional view of the semiconductor structure of FIG. 2 where a first work function metal layer is deposited adjacent the high k material and a first sacrificial patterning material is deposited thereon, in accordance with an embodiment of the present invention.

In various example embodiments, a first work function metal (WFM) layer 34 is deposited adjacent the high k material 32 and a first sacrificial patterning material 36 is deposited thereon.

The first WFM layer 34 is thus deposited on the HK 32 and includes, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN. In one preferred embodiment, the first WFM layer 34 is TiN.

Therefore, the first WFM layer 34 can include a single-element metal, for instance cobalt, titanium, aluminum, or other metals alloys that will allow proper work function to give desired threshold voltage (Vt), such as TiN, TaN, TiC, TiAl, etc. The first WFM layer 34 can be deposited by, e.g., ALD or PE-ALD.

The first sacrificial patterning material 36 can be, e.g., amorphous conformal carbon.

The first sacrificial patterning material 36 can be deposited by a suitable deposition process, for example, CVD, or other suitable process.

Figure 4:
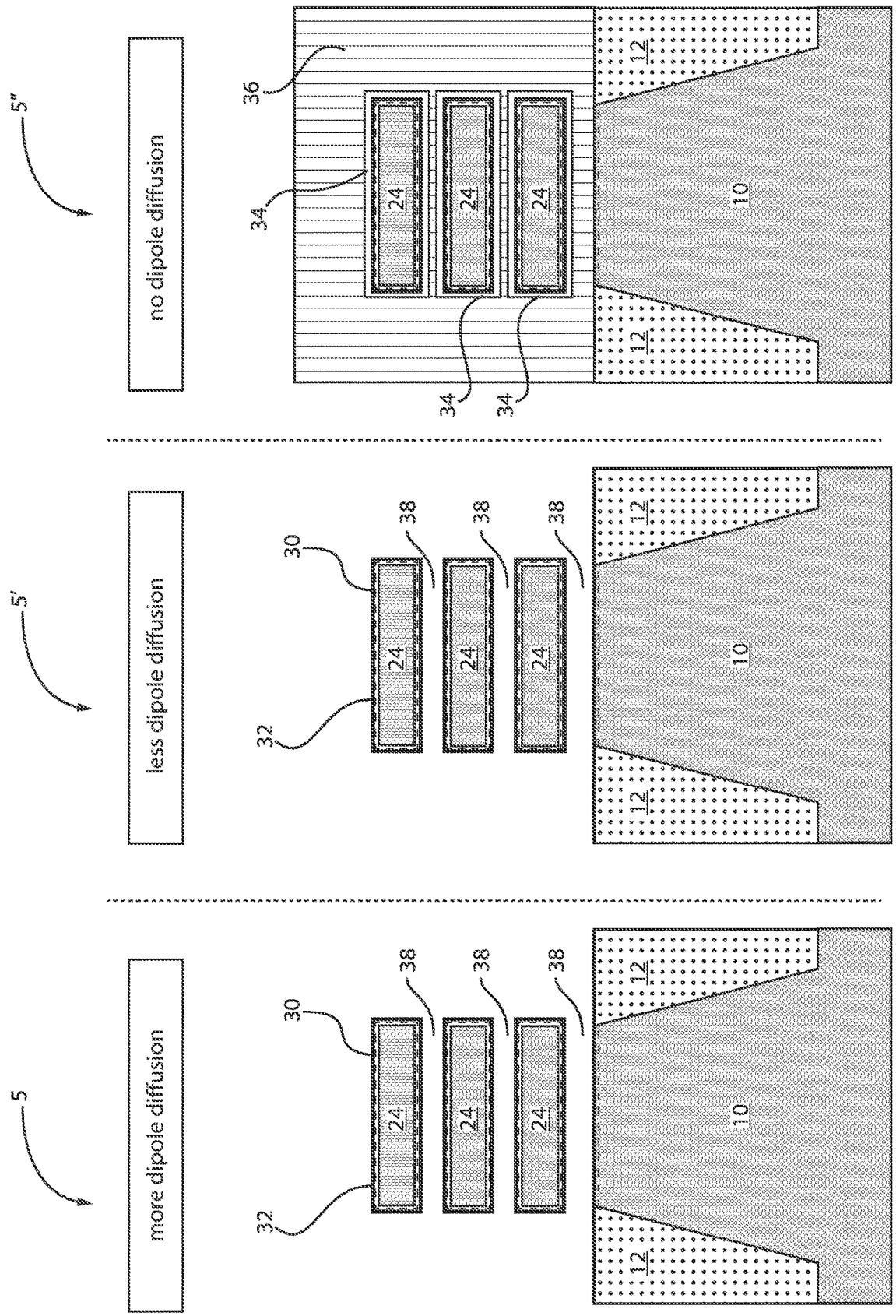
FIG. 4 is a cross-sectional view of the semiconductor structure of FIG. 3 where patterning takes place and the first work function metal layer is removed from select regions (more dipole diffusion gate stack and less dipole diffusion gate stack), in accordance with an embodiment of the present invention.

FIG. 4 is a cross-sectional view of the semiconductor structure of FIG. 3 where patterning takes place and the first work function metal layer is removed from select regions (more dipole diffusion gate stack and less dipole diffusion gate stack), in accordance with an embodiment of the present invention.

In various example embodiments, the first sacrificial patterning material 36 can be removed from the more dipole diffusion gate stack (structure 5) and less dipole diffusion gate stack (structure 5') by a suitable stripping process. For example, the first sacrificial patterning material 36 can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide.

The first WFM layer 34 is also removed from the more dipole diffusion gate stack (structure 5) and less dipole diffusion gate stack (structure 5') by a suitable stripping process.

The removal of the first sacrificial patterning material 36 from the more dipole diffusion gate stack (structure 5) and less dipole diffusion gate stack (structure 5'), and the removal of the first WFM layer 34 results in exposure of the IL 30 and the HK 32 in structures 5, 5'. Additionally, gaps 38 are formed between the remaining semiconductor layers 24. The first WFM layer 34 remains only in structure 5".

Figure 5:
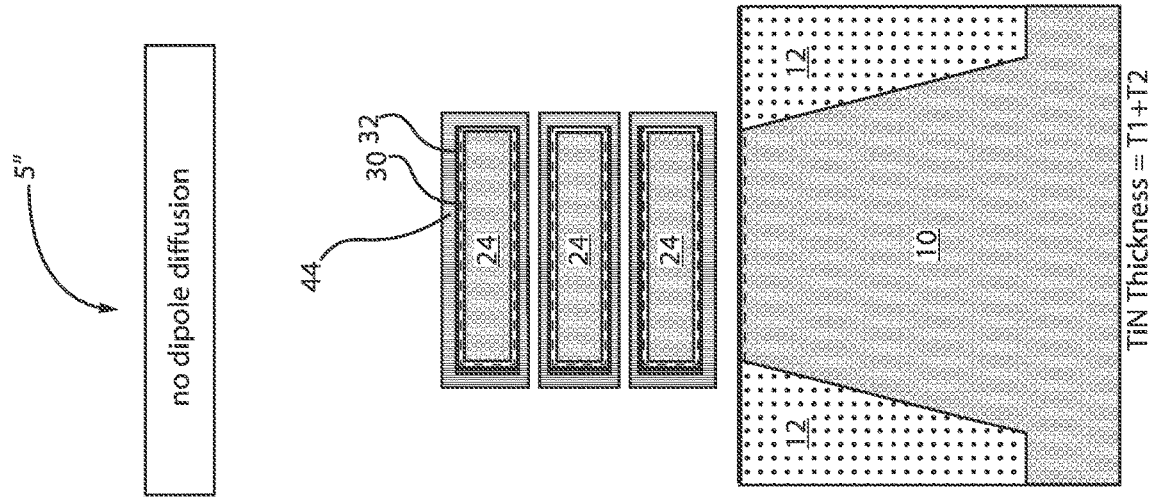
FIG. 5 is a cross-sectional view of the semiconductor structure of FIG. 4 where the first sacrificial patterning material is removed from the no dipole diffusion gate stack to expose the first work function metal layer and a second work function metal layer is deposited thereafter, in accordance with an embodiment of the present invention.
Figure 5:
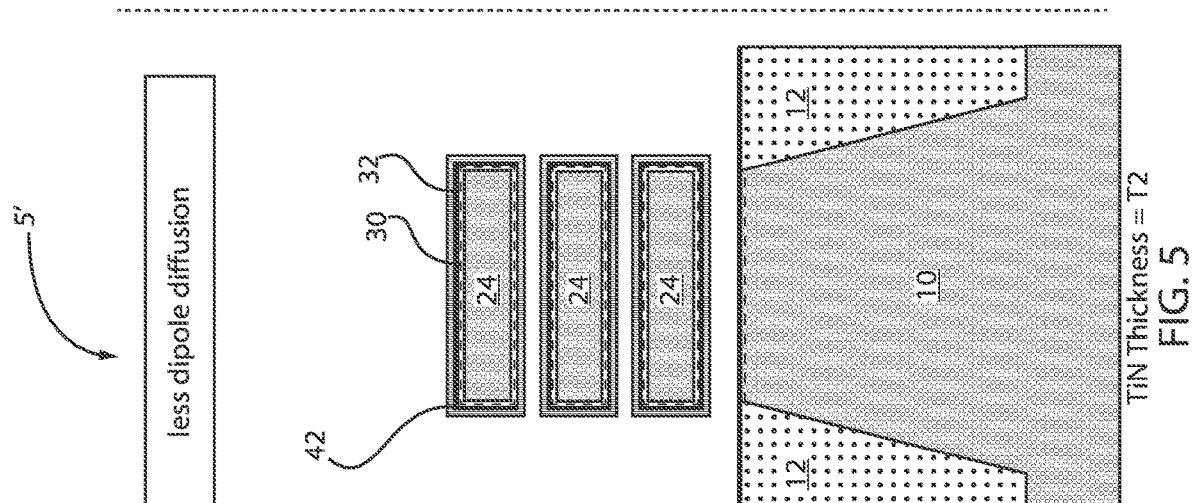
Figure 5:
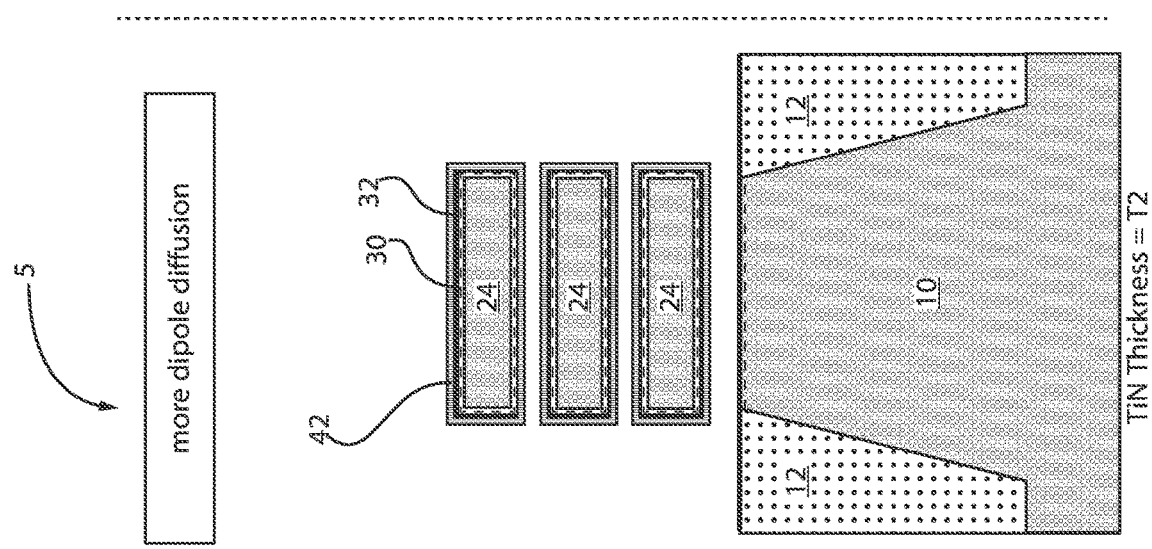

FIG. 5 is a cross-sectional view of the semiconductor structure of FIG. 4 where the first sacrificial patterning material is removed from the no dipole diffusion gate stack to expose the first work function metal layer and a second work function metal layer is deposited thereafter, in accordance with an embodiment of the present invention.

In various example embodiments, the first sacrificial patterning material 36 is removed from the no dipole diffusion gate stack (structure 5") to expose the first WFM layer 34. A second WFM layer 42 is then deposited. Thus, the more dipole diffusion gate stack (structure 5) and the less dipole diffusion gate stack (structure 5') include only the second WFM layer 42 (where thickness=T2), whereas the no dipole diffusion gate stack 5" includes WFM layer 44 (where thickness=T1+T2), which is a combination of first WFM layer 34 and second WFM layer 42. As a result, the thickness of the combined WFM layer 44 (structure 5") is greater than the thickness of the WFM layer 42 (structures 5, 5').

The second WFM layer 42 is thus deposited on the IL 30 and HK 32 (in structures 5, 5') and on the first WFM layer 34 (structure 5"), and includes, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN. In one preferred embodiment, the second WFM layer 42 is TiN.

Therefore, the second WFM layer 42 can include a single-element metal, for instance cobalt, titanium, aluminum, or other metals alloys that will allow proper work function to give desired threshold voltage (Vt), such as TiN, TaN, TiC, TiAl, etc. The second WFM layer 42 can be deposited by, e.g., ALD or PE-ALD.

Figure 6:
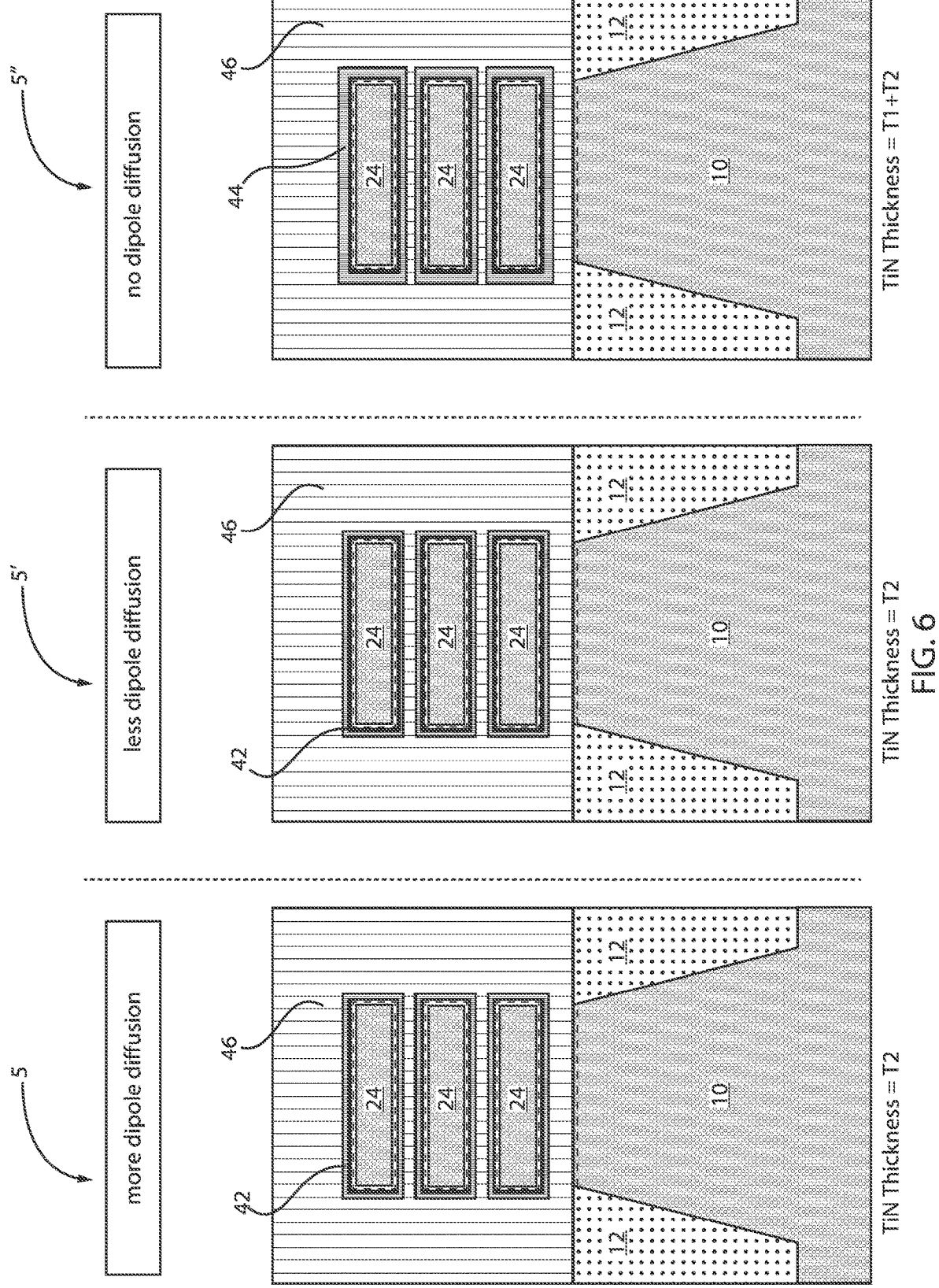
FIG. 6 is a cross-sectional view of the semiconductor structure of FIG. 5 where a second sacrificial patterning material is deposited, in accordance with an embodiment of the present invention.

FIG. 6 is a cross-sectional view of the semiconductor structure of FIG. 5 where a second sacrificial patterning material is deposited, in accordance with an embodiment of the present invention.

In various example embodiments, a second sacrificial patterning material 46 is deposited in all three structures 5, 5', 5".

Figure 7:
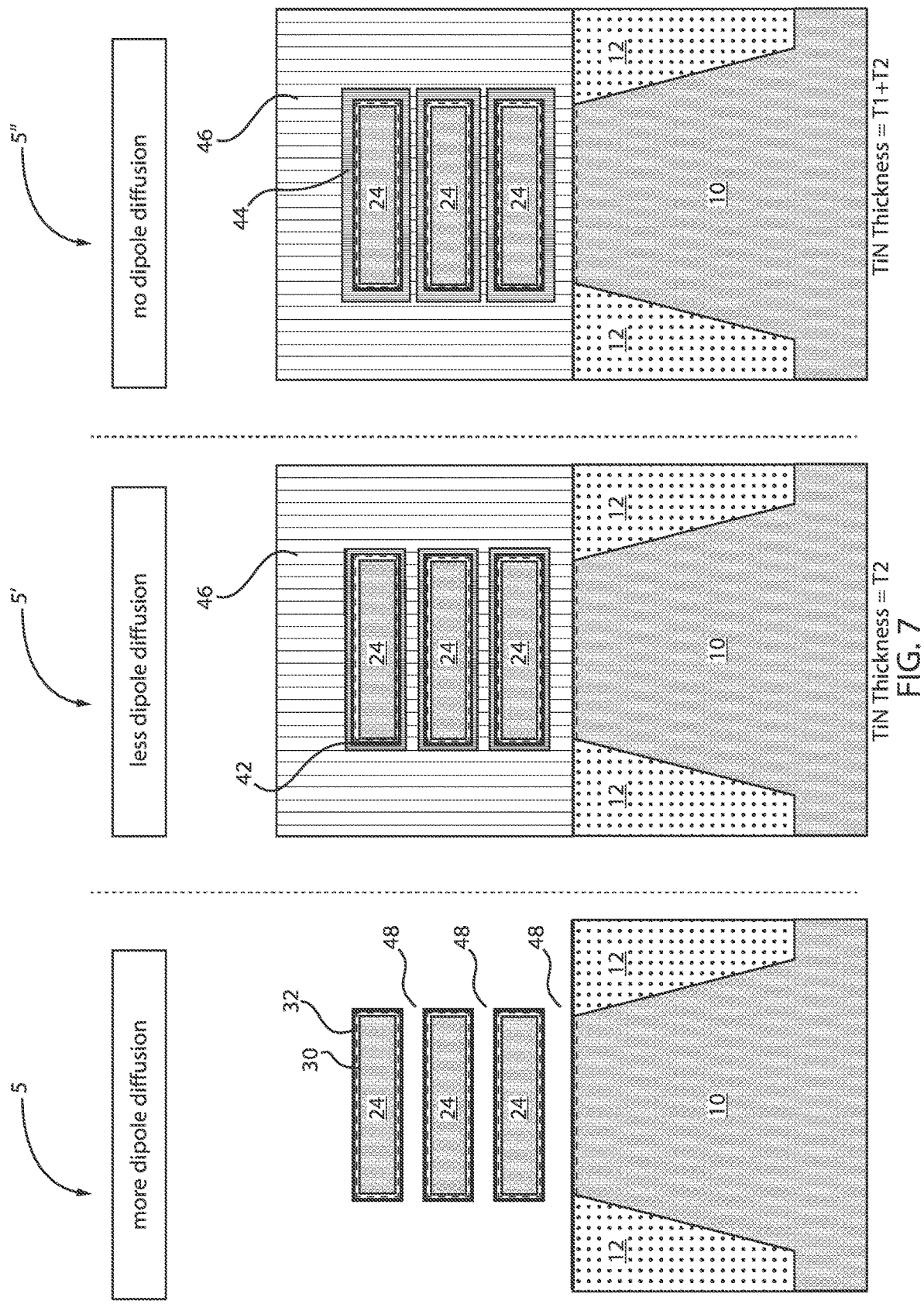
FIG. 7 is a cross-sectional view of the semiconductor structure of FIG. 6 where the second sacrificial patterning material and the second work function metal layer are removed from the more dipole diffusion gate stack, in accordance with an embodiment of the present invention.

FIG. 7 is a cross-sectional view of the semiconductor structure of FIG. 6 where the second sacrificial patterning material and the second work function metal layer are removed from the more dipole diffusion gate stack, in accordance with an embodiment of the present invention.

In various example embodiments, the second sacrificial patterning material 46 and the second work function metal layer 42 are removed from the more dipole diffusion gate stack (structure 5). Thus, the IL 30 and the HK 32 are exposed in structure 5. In structure 5', the second WFM layer 42 remains intact and in structure 5", the WFM layer 44 remains intact. The WFM layer 44 includes first WFM layer 34 and second WFM layer 42.

Figure 8:
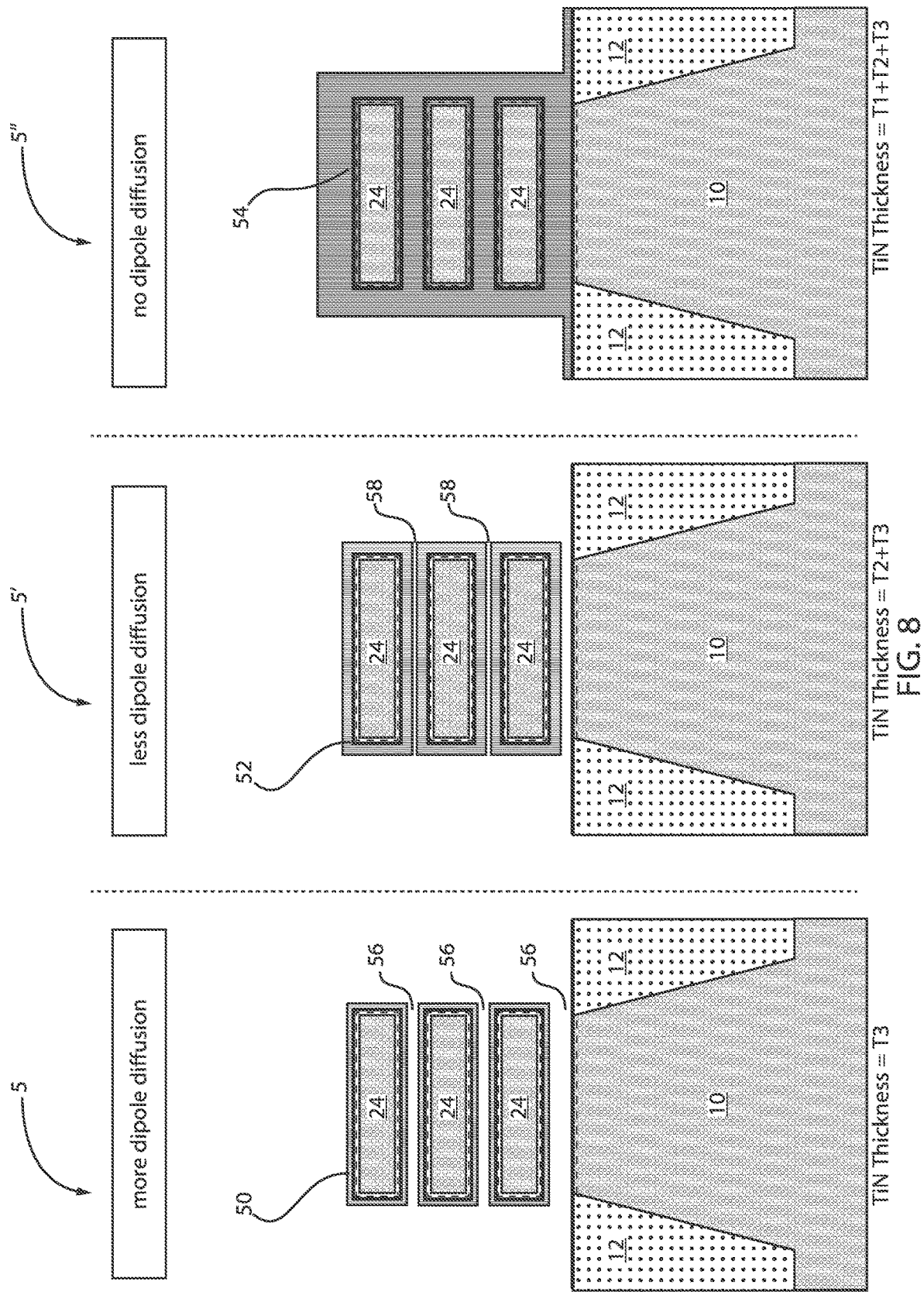
FIG. 8 is a cross-sectional view of the semiconductor structure of FIG. 7 where the second sacrificial patterning material is removed to expose the second work function metal layer in the less dipole diffusion gate stack and the first and second work function metal layers in the no dipole diffusion gate stack, and a third work function metal layer is deposited thereafter, in accordance with an embodiment of the present invention.

FIG. 8 is a cross-sectional view of the semiconductor structure of FIG. 7 where the second sacrificial patterning material is removed to expose the second work function metal layer in the less dipole diffusion gate stack and the first and second work function metal layers in the no dipole diffusion gate stack, and a third work function metal layer is deposited thereafter, in accordance with an embodiment of the present invention.

In various example embodiments, the second sacrificial patterning material 46 is removed to expose the second WFM layer 42 in the less dipole diffusion gate stack (structure 5') and the first and second WFM layers 34, 42 (or combined WFM layer 44) in the no dipole diffusion gate stack (structure 5"). A third WFM layer 50 is then deposited.

The third WFM layer 50 is thus deposited on the IL 30 and HK 32 (in structures 5), on the second WFM layer 42 (structure 5'), and the WFM layer 44 (structure 5"), and includes, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN. In one preferred embodiment, the third WFM layer 50 is TiN.

Therefore, the third WFM layer 50 can include a single-element metal, for instance cobalt, titanium, aluminum, or other metals alloys that will allow proper work function to give desired threshold voltage (Vt), such as TiN, TaN, TiC, TiAl, etc. The third WFM layer 50 can be deposited by, e.g., ALD or PE-ALD.

This deposition results in the third WFM layer 50 (where thickness=T3) formed in the structure 5 (more dipole diffusion). Structure 5' includes second WFM layer 42 and third WFM layer 50, thus forming combined WFM layer 52 (where thickness=T2+T3). WFM layer 52 is thicker than third WFM layer 50. Structure 5" includes first WFM layer 34, second WFM layer 42 and third WFM layer 50, thus forming combined WFM layer 54 (where thickness=T1+T2+T3). Therefore, structure 5 includes one WFM layer, structure 5' includes two WFM layers, and structure 5" includes three WFM layers. WFM layer 54 is greater than WFM layer 52, which in turn is greater than WFM 50. In other words, WFM layer 54 has a greater thickness than WFM layer 52, which in turn has a greater thickness than WFM 50. The different thicknesses will enable different diffusion levels in a subsequent dipole material deposition and anneal (FIGS. 9 and 10).

In structure 5 (more dipole diffusion), gaps 56 are formed between the remaining semiconductor material 24 of the nanosheet stack 20. In structure 5' (less dipole diffusion), gaps 58 are formed between the remaining semiconductor material 24 of the nanosheet stack 20. Gaps 56 are greater than or larger than gaps 58 because the thickness of WFM layer 52 is greater than the thickness of WFM layer 50. In structure 5" (no dipole diffusion), there is no gaps between the remaining semiconductor material 24 of the nanosheet stack 20. Instead, the WFM layer 54 completely fills or occupies the space between the remaining semiconductor material 24 of the nanosheet stack 20.

Figure 9:
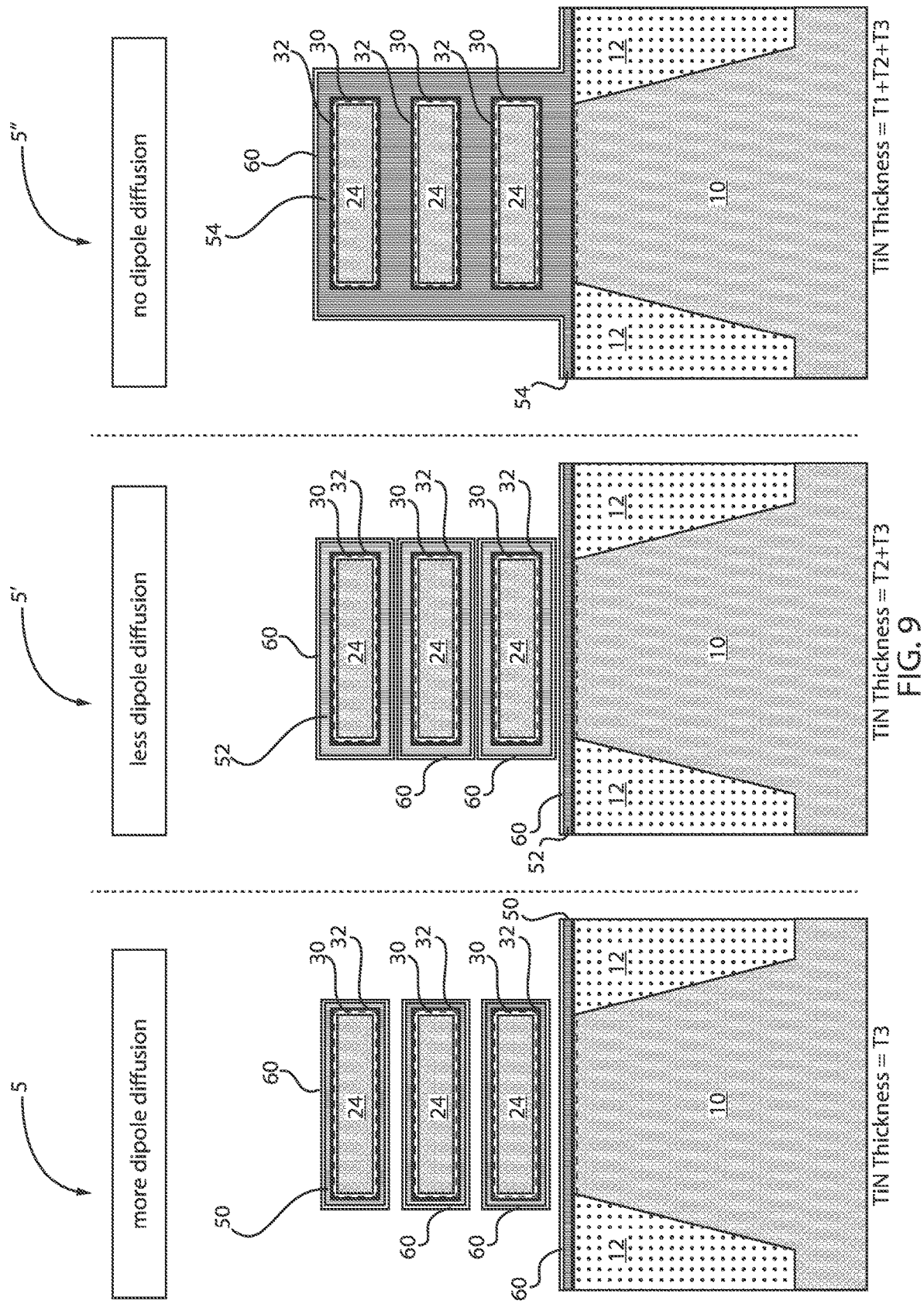
FIG. 9 is a cross-sectional view of the semiconductor structure of FIG. 8 where a dipole material is deposited, in accordance with an embodiment of the present invention.
Figure 10:
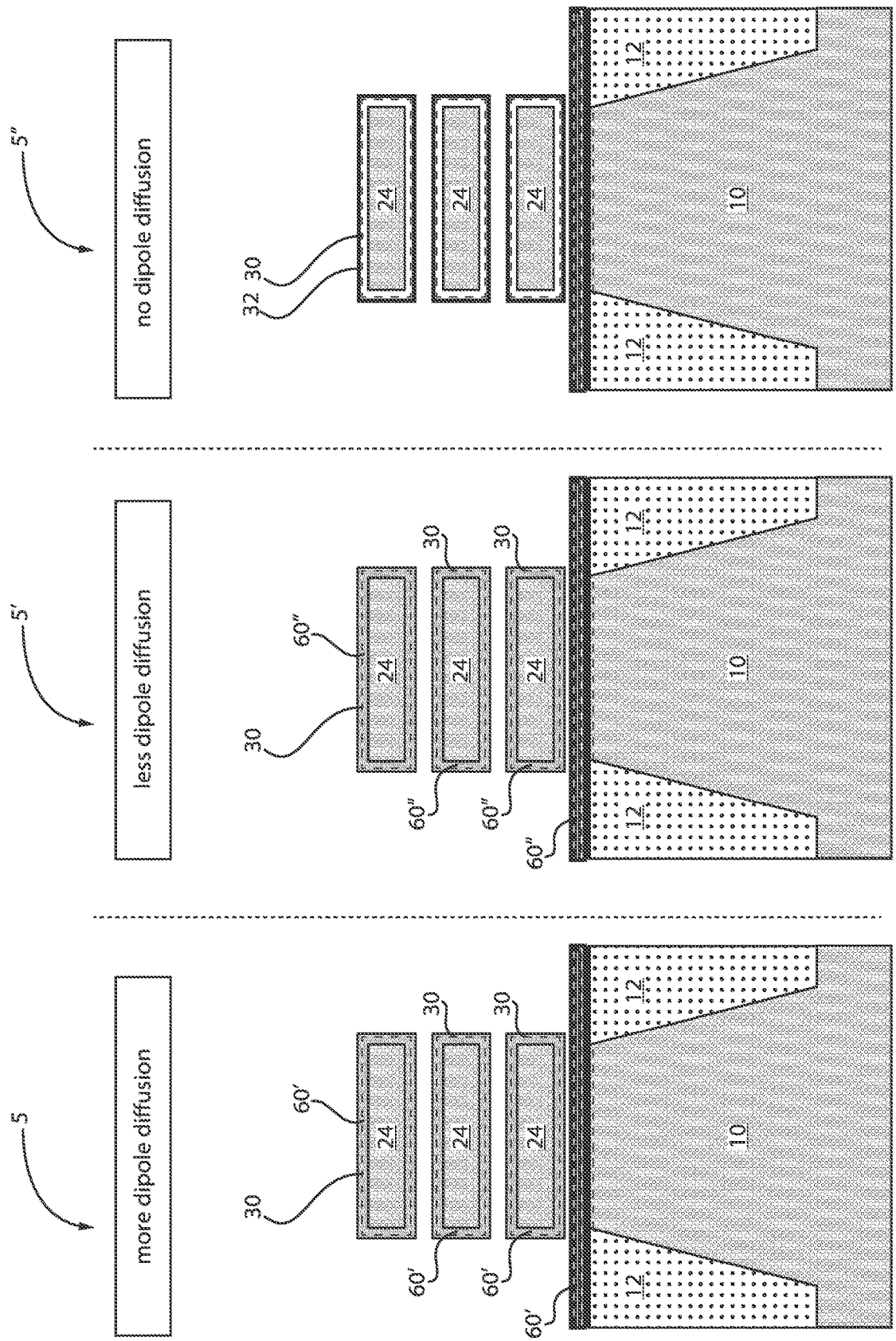
FIG. 10 is a cross-sectional view of the semiconductor structure of FIG. 9 where an anneal is performed to drive the dipole material into the IL, in accordance with an embodiment of the present invention.

FIG. 9 is a cross-sectional view of the semiconductor structure of FIG. 8 where a dipole material is deposited, in accordance with an embodiment of the present invention.

In various example embodiments, a dipole material 60 is deposited over the WFM layers 50, 52, 54.

The dipole material 60 wraps around the WFM layers 50, 52, 54. In one example, the dipole material 60 can be, e.g., lanthanum oxide (LaO). One skilled in the art can contemplate other earth elements employed to be diffused into HK layers, such, but not limited to, dysprosium (Dy).

FIG. 10 is a cross-sectional view of the semiconductor structure of FIG. 9 where an anneal is performed to drive the dipole material into the IL, in accordance with an embodiment of the present invention.

In various example embodiments, an anneal can take place to drive the dipole material 60 into the IL 30, HK 32.

The exemplary embodiments of the present invention employ dipole deposition and anneal such that the dipole material 60 diffuses through the HK 32, and into the IL 30, where there is more dipole diffusion in structure 5 (thinner WFM), less dipole diffusion in structure 5' (thicker WFM), and no dipole diffusion in structure 5" (thickest WFM). Thus, different threshold voltages (Vt) can be provided. In other words, a dipole material 60 and different thicknesses for WFM layers 50, 52, 54 are employed to modulate Vt to construct WFM gate structures with multiple threshold voltages.

Stated differently, dipole concentration is different in IL 30 to achieve different Vt flavor devices. The different thicknesses of WFM layers 50, 52, 54 enable different diffusion levels in the IL 30. In structure 5, the thinner WFM layer 50 allows for more dipole diffusion into IL 30. In structure 5', the thicker WFM layer 52 allows for less dipole diffusion into IL 30. In structure 5", the thickest WFM layer 54 does not allow for dipole diffusion into IL 30, that is, the thickness of WFM layer 54 completely blocks any dipole diffusion into IL 30. The dipole deposition in structure 5 results in IL 60' and the dipole deposition in structure 5' results in IL 60". The dipole deposition in structure 5" results in the original IL 30, which remains unmodified as the dipole material 60 does not penetrate into the IL 30.

This results in effective modulation of the threshold voltage without patterning between nanosheet channels. Thus, a single dipole layer thickness can be used to achieve more than three Vt pairs by adjusting sacrificial material thicknesses. In other words, the thickness of the WFM layers can control the amount of dipole material diffused into the IL layer of the metal gate.

Figure 11:
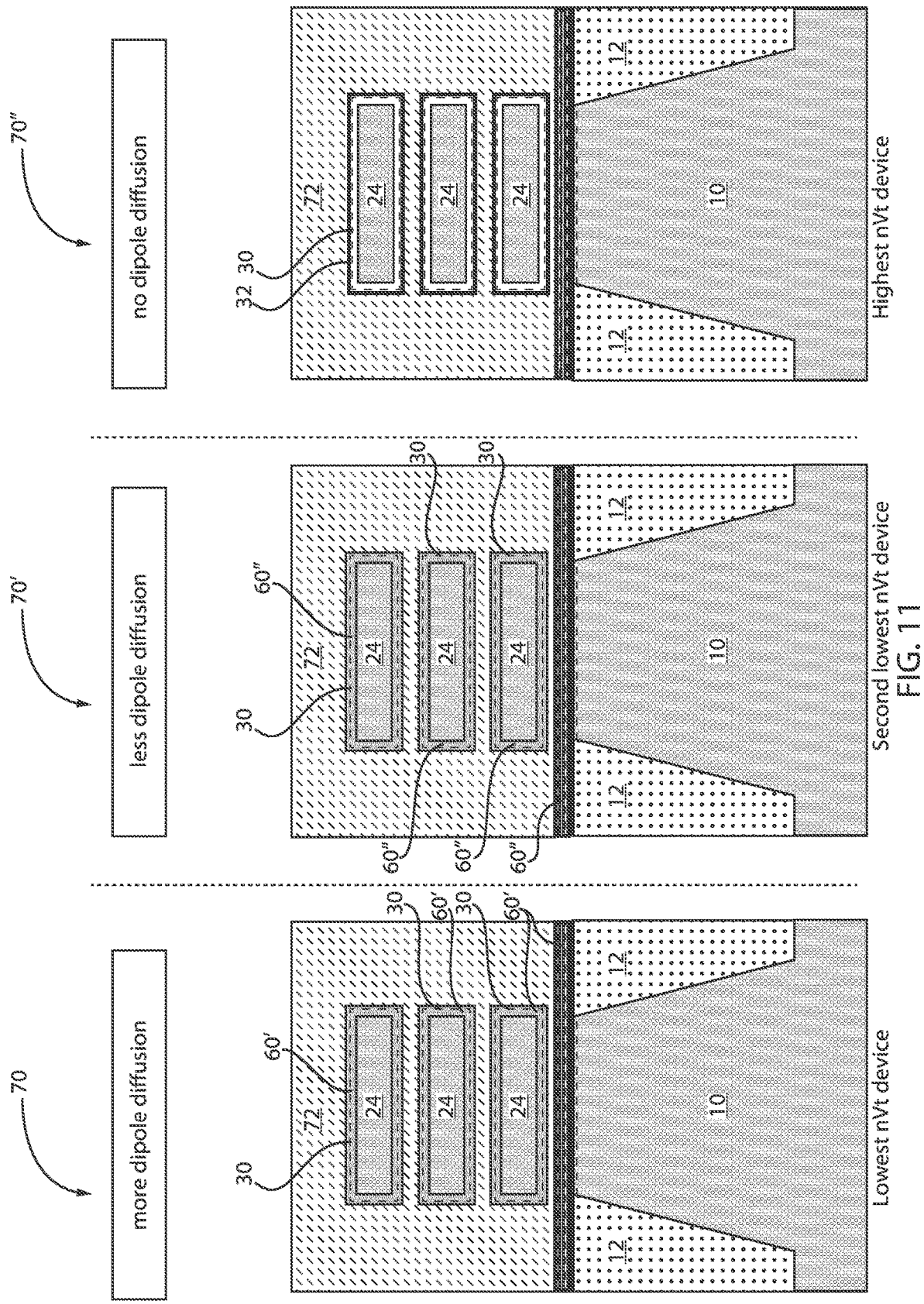
FIG. 11 is a cross-sectional view of the semiconductor structure of FIG. 10 where a metal gate is formed over the multiple work function gate stacks, in accordance with an embodiment of the present invention.

FIG. 11 is a cross-sectional view of the semiconductor structure of FIG. 10 where a metal gate is formed over the multiple work function gate stacks, in accordance with an embodiment of the present invention.

In various example embodiments, a metal gate 72 is formed over the multiple work function gate stacks 70, 70' 70". Structure 70 is the lowest nVt device, structure 70' is the second lowest nVt device, and structure 70" is the highest nVt device.

The metal gate 72 can be a metal, such as, e.g., copper (Cu), cobalt (Co), aluminum (Al), platinum (Pt), gold (Au), tungsten (W), titanium (Ti), nitride (N) or any combination thereof. The metal gate 72 can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the metal gate 72 can be reduced by chemical-mechanical polishing (CMP) and/or etching. Therefore, the planarization process can be provided by CMP. Other planarization process can include grinding and polishing.

In summary, the exemplary embodiments of the present invention solve multi-Vt challenges for gate-all-around transistors without sacrificing device performance. The exemplary embodiments use the unique property of dipole diffusion amount to create different threshold voltage (Vt) flavors. In addition, the exemplary embodiments use different sacrificial metal thicknesses underneath the dipole layer to selectively block part of dipole diffusion and to create different Vt flavors. Thus, a NS multi-Vt scheme with dipole engineering can be achieved without the need for dipole patterning.

In some embodiments, the nanosheet stacks can include a thin layer of conducting channel material. For example, in some embodiments, one or more of the nanosheet stacks can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example indium gallium arsenide (InGaAs), or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

The dry and wet etching processes employed in the exemplary embodiments can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a multi-Vt scheme with same dipole thickness for gate-all-around transistors (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for attaining different gate threshold voltages across a plurality of field effect transistor (FET) devices without patterning between nanosheet channels, the method comprising:
  forming a first nanosheet stack, a second nanosheet stack, and a third nanosheet stack;
  depositing an interfacial layer (IL) and a high-k (HK) layer within the first, second, and third nanosheet stacks;
  selectively depositing a first work function metal (WFM) layer within the first nanosheet stack having a first thickness;
  selectively depositing a second WFM layer within the second nanosheet stack having a second thickness, wherein the second thickness is greater than the first thickness;
  selectively depositing a third WFM layer within the third nanosheet stack having a third thickness, wherein the third thickness is greater than the second thickness;
  depositing a dipole material adjacent the first, second, and third WFM layers; and
  diffusing the dipole material, by anneal, into the IL of the first and second nanosheet stacks to provide different gate threshold voltages for the plurality of FET devices.

2. The method of claim 1, wherein the dipole material is lanthanum oxide (LaO).

3. The method of claim 1, wherein the first nanosheet stack defines a first FET device where a first dipole diffusion amount occurs.

4. The method of claim 3, wherein the second nanosheet stack defines a second FET device where a second dipole diffusion amount occurs, wherein the second dipole diffusion amount is less than the first dipole diffusion amount.

5. The method of claim 4, wherein the third nanosheet stack defines a third FET device where no diffusion occurs.

6. The method of claim 1, further comprising depositing a metal gate over the plurality of FET devices having the different gate threshold voltages.

7. The method of claim 1, wherein the first, second, and third WFM layers include titanium nitride (TiN).

8. The method of claim 1, wherein dipole concentration is different in the IL of each of the plurality of FET devices.

9. A method for attaining different gate threshold voltages across a plurality of field effect transistor (FET) devices without patterning between nanosheet channels, the method comprising:
   forming a plurality of nanosheet stacks;
   depositing an interfacial layer (IL) and a high-k (HK) layer within each of the plurality of nanosheet stacks;
   selectively depositing work function metal (WFM) layers with different thicknesses adjacent the plurality of nanosheet stacks;
   depositing a dipole material adjacent the WFM layers; and
   diffusing the dipole material, by anneal, into the IL of at least one of the plurality of nanosheet stacks to provide different gate threshold voltages for the plurality of FET devices.

10. The method of claim 9, wherein the dipole material is lanthanum oxide (LaO).

11. The method of claim 9, wherein a first nanosheet stack of the plurality of nanosheet stacks defines a first FET device where a first dipole diffusion amount occurs.

12. The method of claim 11, wherein a second nanosheet stack of the plurality of nanosheet stacks defines a second FET device where a second dipole diffusion amount occurs, wherein the second dipole diffusion amount is less than the first dipole diffusion amount.

13. The method of claim 12, wherein a third nanosheet stack of the plurality of nanosheet stacks defines a third FET device where no diffusion occurs.

14. The method of claim 9, further comprising depositing a metal gate over the plurality of FET devices having the different gate threshold voltages.

15. The method of claim 9, wherein each of the WFM layers includes titanium nitride (TiN).

16. The method of claim 9, wherein dipole concentration is different in the IL of each of the plurality of FET devices.

17. A semiconductor structure for attaining different gate threshold voltages across a plurality of field effect transistor (FET) devices without patterning between nanosheet channels, the semiconductor structure comprising:
   a plurality of nanosheet stacks;
   an interfacial layer (IL) and a high-k (HK) layer disposed within each of the plurality of nanosheet stacks;
   work function metal (WFM) layers with different thicknesses disposed adjacent the plurality of nanosheet stacks; and
   a dipole material diffused into the IL of at least one of the plurality of nanosheet stacks to provide different gate threshold voltages for the plurality of FET devices.

18. The semiconductor structure of claim 17, wherein the dipole material is lanthanum oxide (LaO).

19. The semiconductor structure of claim 17, wherein dipole concentration is different in the IL of each of the plurality of FET devices.

20. The semiconductor structure of claim 17, wherein a metal gate is disposed over the plurality of FET devices having the different gate threshold voltages.

\* \* \* \* \*